United States Patent
Rubino et al.

(10) Patent No.: US 12,485,276 B1
(45) Date of Patent: Dec. 2, 2025

(54) MINIATURE ACTIVE IMPLANTABLE MEDICAL DEVICE HAVING A HIGH-PURITY FUSED SILICA WAFER ASSEMBLY MICRO-BONDED TO A TITANIUM POWER SOURCE HOUSING

(71) Applicant: Greatbatch Ltd., Clarence, NY (US)

(72) Inventors: Robert S. Rubino, Williamsville, NY (US); Adrish Ganguly, Clarence, NY (US); Jeffrey Salzmann, Lancaster, NY (US)

(73) Assignee: Greatbatch Ltd., Clarence, NY (US)

( * ) Notice: Subject to any disclaimer, the term of this patent is extended or adjusted under 35 U.S.C. 154(b) by 457 days.

(21) Appl. No.: 18/073,657

(22) Filed: Dec. 2, 2022

Related U.S. Application Data

(60) Provisional application No. 63/285,659, filed on Dec. 3, 2021.

(51) Int. Cl.
*A61N 1/05* (2006.01)
*A61N 1/08* (2006.01)

(52) U.S. Cl.
CPC .................. *A61N 1/05* (2013.01); *A61N 1/08* (2013.01); *A61N 1/0563* (2013.01)

(58) Field of Classification Search
CPC .......... A61N 1/05; A61N 1/08; A61N 1/0563; A61N 1/025; A61N 1/0504; A61N 1/36003; A61N 1/36071; A61N 1/36135; A61N 1/362; A61N 1/37288; A61N 1/3756; A61N 1/37512; A61N 1/3758; A61N 1/3754; A61B 2562/0209; A61B 2562/125; A61B 5/025
See application file for complete search history.

(56) References Cited

U.S. PATENT DOCUMENTS

| | | |
|---|---|---|
| 3,281,915 A | 11/1966 | Schramm |
| 7,621,036 B2 | 11/2009 | Cros et al. |
| 8,653,384 B2 | 2/2014 | Tang et al. |
| 10,124,559 B2 | 11/2018 | Sandlin et al. |
| 10,888,009 B2 | 1/2021 | Nielsen et al. |
| 2006/0283007 A1* | 12/2006 | Cros .................... A61B 5/6882 29/25.41 |
| 2013/0068384 A1 | 3/2013 | Liu et al. |
| 2018/0008760 A1* | 1/2018 | Zilbershlag ......... H01M 10/488 |
| 2021/0053163 A1 | 2/2021 | Wetter et al. |

OTHER PUBLICATIONS

"Corning HPFS 7979, 7980, 8655 Fused Silica; Optical Materials Product Information; 2015".

* cited by examiner

*Primary Examiner* — Carl H Layno
*Assistant Examiner* — Anh-Khoa N Dinh
(74) *Attorney, Agent, or Firm* — Michael F. Scalise

(57) ABSTRACT

An active implantable medical device (AIMD) has a high-purity fused silica wafer assembly micro-bonded to the housing for the device's electrical energy power source. During the micro-bonding process, electromagnetic radiation passes through the fused silica wafer but impinges on the metal housing to create a micro-bond at the interface between the two materials. A printed circuit board (PCB) assembly resides inside a power source housing recess closed by the micro-bonded fused silica wafer. Two conductive pathways extend through the fused silica wafer from electrodes supported on a body fluid side of the wafer to the PCB. The PCB, in turn, is connected to the power source to energize the electrodes for providing stimulation therapy to a patient or for sensing biological signals from the patient.

20 Claims, 11 Drawing Sheets

MINIATURE ACTIVE IMPLANTABLE MEDICAL DEVICE HAVING A HIGH-PURITY FUSED SILICA WAFER ASSEMBLY MICRO-BONDED TO A TITANIUM POWER SOURCE HOUSING

CROSS-REFERENCE TO RELATED APPLICATION

This application claims priority to U.S. Provisional Application Ser. No. 63/285,659, filed on Dec. 3, 2021.

BACKGROUND OF THE INVENTION

1. Field of the Invention

The present invention relates to the field of implantable medical devices. More particularly, the present invention relates to a miniature-sized leadless active implantable medical device (AIMD) that is designed to deliver electrical stimulation to a patient or sense biological signals from body tissue. A miniature-sized AIMD is defined as a medical device that has a volume of less than 1 cc. (<1 cc.).

In today's world, the need to make active implantable medical devices (AIMD) as small as possible is an active area of innovation. That is because implanting a miniature-sized AIMD is advantageous over implanting a conventionally-sized pulse generator for many reasons. Chief among them is that the implantation procedure can be performed with far less surgical trauma to the patient. As long as the miniature AIMD has the same or similar functionality as an AIMD of a conventional size, subjecting the patient to less trauma represents an advancement in the industry. This includes implanting a miniature-sized neurostimulator for pain therapy. Additionally, a miniature-sized AIMD can be applied to many more nerves than a relatively large conventionally-sized AIMD, particularly to smaller nerves.

The present invention offers a solution to current implantable medical device size limitations by micro-bonding a transparent high-purity fused silica wafer to the titanium housing for the electrical energy power source for the device. Incorporating a transparent high-purity fused silica wafer as part of the medical device enclosure means that a printed circuit board (PCB) assembly containing an application-specific integrated circuit (ASIC) can be mounted or supported on the fused silica wafer or the ASIC and associated electronics can be mounted directly to circuit traces on the high-purity fused silica wafer. The PCB assembly controls the various functions of the medical device, including having electrodes deliver electrical stimulation to a patient and sense biological signals from body tissue.

At least two spaced-apart superficial discrete electrodes are supported on an outer surface of the fused silica wafer. The discrete electrodes are configured to provide current to body tissue and/or to sense electrical signals from body tissue in a radiating pattern that is substantially directly in front of them. As an inherently electrically insulative material, the high-purity fused silica wafer isolates the electrodes from each other and from the housing of the electrical energy power source.

A charging antenna or coil supported by the PCB assembly opposite the at least two discrete electrodes is configured to charge a Li-ion battery or capacitor. The discrete electrodes are connected to the PCB assembly by electrically conductive pathways comprising a via containing gold, Au/Pt alloy, or rhodium extending through the high-purity fused silica wafer.

2. Prior Art

Conventional leadless implantable medical devices have a metallic housing. The metallic housing supports at least two spaced-apart electrodes that are configured to send electrical pulses to the surrounding body tissue or sense biological signals from the body tissue. The stimulation and sensing electrodes are electrically energized by electronic circuits housed inside the medical device housing. Since the stimulation and sensing electrodes need to be in contact with the surrounding body tissue to function properly, they must be hermetically sealed in the device housing or its header and electrically isolated from the metallic housing. In that respect, including the features needed to support and hermetically seal the stimulation and sensing electrodes in the device housing, the electrodes and their associated support structures consume a relatively large amount of space in the medical device.

Moreover, the metallic housing can interfere with two-way communication between the medical device and an associated patient programmer or clinician programmer. These programmers are used by the patient and the clinician to configure the medical device to operate in a desired manner. A patient programmer is used by the patient in whom the medical device is implanted to adjust the parameters of electrical stimulation delivered by the device. A clinician programmer is used by medical personnel to configure and adjust stimulation parameters that the patient is not permitted to control. However, a metallic device housing may interfere with the inductive signals that are transmitted back and forth from the patient and clinician programmers to the medical device. A metallic device housing may also interfere with the inductive or RF charging signals that are used to recharge the electrical power source of the medical device.

Therefore, there is a desire to overcome these shortcomings by providing a leadless and rechargeable AIMD having at least two spaced-apart electrodes that are electrically isolated from the metal housing for the medical device or the metal housing for its electrical power source without added structure to effect electrical isolation. Further, there is a desire to enable inductive charging of the electrical energy power source and to provide two-way communication with the medical device without adversely impacting the efficiency of the inductive charging/communication antenna. There is also a desire to realize these advantages with an AIMD having a volume that is less than 1 cc. A smaller medical device is easier to implant in a patient and would be expected to cause less trauma to the patient.

SUMMARY OF THE INVENTION

The present invention is directed to a miniature-sized leadless active implantable medical device (AIMD). The miniature-sized AIMD comprises a high-purity fused silica wafer assembly which is micro-bonded to the housing for the device's electrical energy power source. The power source housing is formed from a biocompatible material, for example, titanium.

While a high-purity fused silica wafer is transparent to electromagnetic radiation (EM) emitted by a laser, the power source housing is not. Therefore, electromagnetic radiation, which is used to connect the high-purity fused silica wafer to the power source housing, passes through the fused silica wafer but impinges on the metal housing to create a micro-bond at the interface between the two materials. If it is desired to micro-bond a second high-purity fused silica wafer to the first silica wafer, the micro-bond between the first fused silica wafer/power source housing is first created followed by micro-bonding the second fused silica wafer to the first wafer.

The laser welding process is unique to a fused silica wafer, which is subjected to minimal heat load, thereby leaving the bulk material undisturbed. The incident laser energy is concentrated in a highly localized area at the interface between the fused silica wafer and the titanium power source housing. This so-called "cold-welding process" helps to protect the medical device's PCB/ASIC assembly and electrical energy power source from heat damage. That is in comparison to conventional ceramic to metal brazing, which typically occurs at temperatures that range from about 600° C. to about 1,000° C. These elevated temperatures would destroy the PCB/ASIC assembly and the electrical energy power source.

Prior to the micro-bonding process, however, at least two electrically conductive pathways are provided by forming at least two vias through the outermost high-purity fused silica wafer using laser-induced etching, followed by filling the vias with an electrically conductive material. Filling the vias involves formation of a precious metal seed layer by magnetron sputtering followed by plating both sides of the wafer with the metal that is intended as the conductive pathway, for example, gold or an Au/Pt alloy, to fill the vias. The conductive pathways extend from at least two spaced-apart superficial stimulation or sensing electrodes supported on an outer surface of the high-purity fused silica wafer to a PCB/ASIC assembly supported on an inner surface of the fused silica wafer. The electronic circuits of the PCB in turn draw power from the electrical energy power source.

In that manner, the at least two superficial electrodes are energized to either provide electrical stimulation to body tissue in which the medical device is implanted, sense biological signals from adjacent body tissue, or both. Thus, providing the at least two spaced-apart electrodes as superficial electrodes supported on the high-purity fused silica wafer portion of the medical device housing means that the amount of space the electrodes and their connections to the electrical components supported on the PCB represents a significant improvement in space savings in comparison to a convention leadless implantable medical device having a metallic housing.

Moreover, the high-purity fused silica wafer portion of the medical device housing does not interfere with the communication/charging fields that are transmitted between external devices and the medical device when it is implanted in body tissue. These include communication signals from patient and clinician programmers to the implanted medical device, and inductive or RF (radio frequency) charging signals sent from an external charging transmitter to the power source charging antenna. This means that the communication and charging antennas can be placed inside the fused silica portion of the device housing, which further reduces the device's volume and manufacturing complexity.

Furthermore, the present invention is not limited to a defined number of electrodes. While there are at least two electrodes in a system, depending on the medical application that the AIMD is designed for, there can be many more electrodes than two electrodes. In lieu of or in addition to the at least two electrodes, there can also be a sensing element such as an optical sensor, motion sensor, acoustic sensor, pressure sensor, analyte sensor, electromagnetic sensor incorporated into the system.

These and other aspects of the present invention will become increasingly more apparent to those skilled in the art by reference to the following detailed description and to the appended drawings.

DETAILED DESCRIPTION OF THE PREFERRED EMBODIMENTS

As described in this specification, a high-purity fused silica wafer is commercially available from numerous manufacturers. A suitable high-purity fused silica wafer has a thickness that ranges from about 100 µm to about 4 mm. One source is Corning, Incorporated, Corning, New York under the designations 7979, 7980 and 8655, designation 7980 being preferred.

Figure 1:
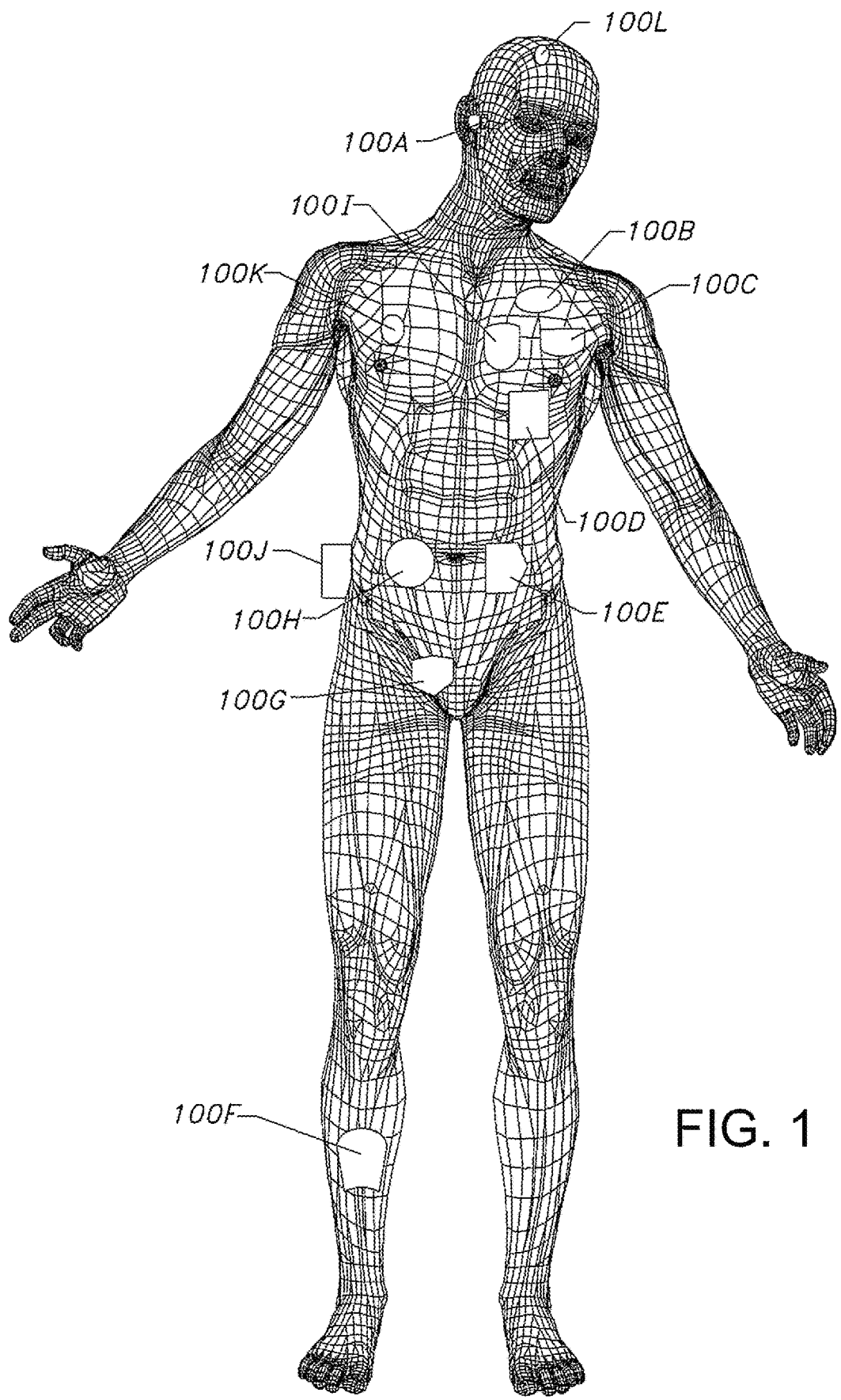
FIG. 1 is a wire formed diagram of a generic human body showing a number of medical devices 100A to 100L according to the present invention that can either be implanted in a patient's body tissue or attached externally to the body.

Turning now to the drawings, FIG. 1 is a wire form diagram of a generic human body illustrating various types of active implantable and external medical devices according to the present invention that can either be implanted in a patient's body or attached externally to the body.

Numerical designation 100A represents a family of hearing devices which can include the group of cochlear implants, piezoelectric sound bridge transducers, and the like.

Numerical designation 100B represents a variety of neurostimulators, brain stimulators, and sensors. Neurostimulators are used to stimulate the Vagus nerve, for example, to treat epilepsy, obesity, and depression. Brain stimulators are pacemaker-like devices and include electrodes implanted deep into the brain for sensing the onset of a seizure and also for providing electrical stimulation to brain tissue to prevent a seizure from actually occurring. If present, the lead wires associated with a deep brain stimulator are often placed using real time MRI imaging. Sensors include optical sensors, motion sensors, acoustic sensors, pressure sensors, analyte sensors, and electromagnetic sensors, among others.

Numerical designation 100C shows a cardiac pacemaker which is well-known in the art.

Numerical designation 100D includes the family of left ventricular assist devices (LVADs), and artificial heart devices.

Numerical designation 100E includes a family of drug pumps which can be used for dispensing insulin, chemotherapy drugs, pain medications, and the like.

Numerical designation 100F includes a variety of bone growth stimulators for rapid healing of fractures.

Numerical designation 100G includes urinary incontinence devices.

Numerical designation 100H includes the family of pain relief spinal cord stimulators and anti-tremor stimulators.

Numerical designation 100H also includes an entire family of other types of neurostimulators used to block pain.

Numerical designation 100I includes a family of implantable cardioverter defibrillator (ICD) devices and also includes the family of congestive heart failure devices (CHF). This is also known in the art as cardio resynchronization therapy devices, otherwise known as CRT devices.

Numerical designation 100J illustrates an externally worn pack. This pack could be an external insulin pump, an external drug pump, an external neurostimulator or even a ventricular assist device.

Numerical designation 100K illustrates one of various types of EKG/ECG external skin electrodes which can be placed at various locations.

Numerical designation 100L represents external EEG electrodes that are placed on the head.

Figure 2:
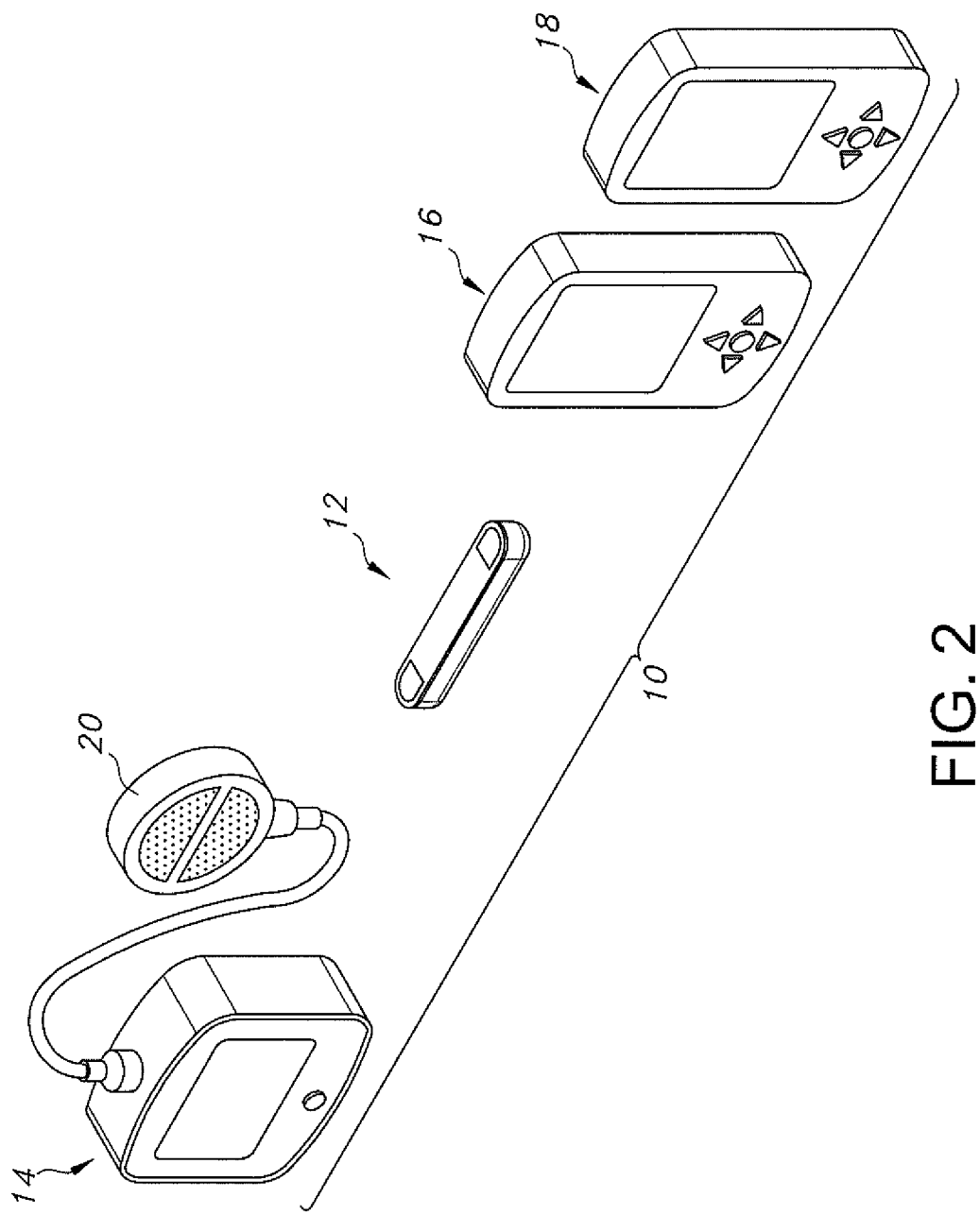
FIG. 2 is a simplified block diagram of an exemplary medical system 10 according to the present invention.

To provide context to the various medical devices 100A to 100L illustrated in FIG. 1, FIG. 2 illustrates a simplified block diagram of an exemplary medical system 10 according to the present invention. The medical system 10 includes a leadless active implantable medical device (AIMD) 12, which is any one of various types of known implantable medical devices that can be implanted in a patient's body tissue. Those include leadless versions of the medical devices 100A to 100L illustrated in FIG. 1. The medical system 10 also has an external charger 14, a patient programmer 16, and a clinician programmer 18.

The patient programmer 16 and the clinician programmer 18 may be portable handheld devices, such as a smartphone or other custom device, that are used to configure the AIMD 12 so that the AIMD can operate in a desired manner. The patient programmer 16 is used by the patient in whom the AIMD 12 is implanted. The patient may adjust the parameters of electrical stimulation delivered by the AIMD 12, such as by selecting a stimulation program, changing the amplitude and frequency of the electrical stimulation, among other parameters, and by turning stimulation on and off. Additionally, the patient programmer 16 may collect and or display data being collected by the device and alert the patient to potential health risks.

The clinician programmer 18 is used by medical personnel to configure the other system components and to adjust stimulation parameters that the patient is not permitted to control. These include setting up stimulation programs among which the patient may choose and setting upper and lower limits for the patient's adjustments of amplitude, frequency, and other parameters. It is also understood that although FIG. 2 illustrates the patient programmer 16 and the clinician programmer 18 as two separate devices, they may be integrated into a single programmer in some embodiments.

Electrical power may be delivered to the AIMD 12 through an external charging pad 20 that is connected to the external charger 14. In some embodiments, the external charging pad 20 is configured to directly power the AIMD 12 or it is configured to charge a rechargeable electrical energy power source 22 (FIGS. 3A, 4, 9A and 10) of the AIMD. The external charging pad 20 can be a hand-held device that is connected to the external charger 14, or it can be an internal component of the external charger. The external charger 14 and the charging pad 20 can also be integrated into a single device that is strapped on or attached to the patient with adhesive.

Figure 3A:
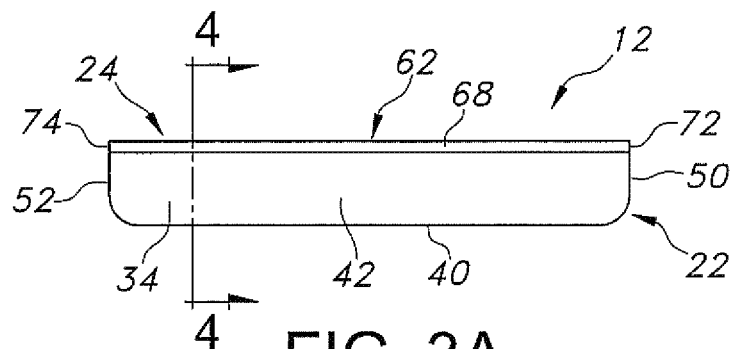
FIG. 3A is a side elevational view of an active implantable medical device (AIMD) 12 according to one embodiment of the present invention.
Figure 3B:
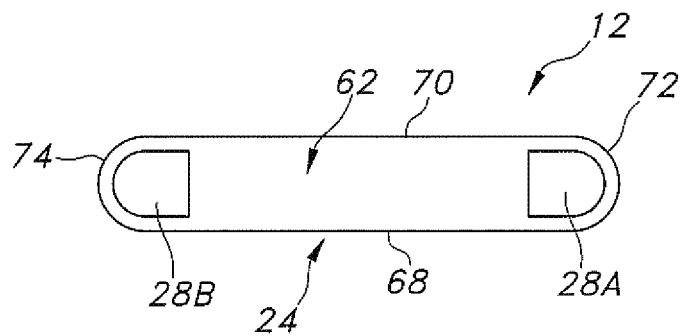
FIG. 3B is a plan view of the AIMD 12 shown in FIG. 3A.
Figure 4:
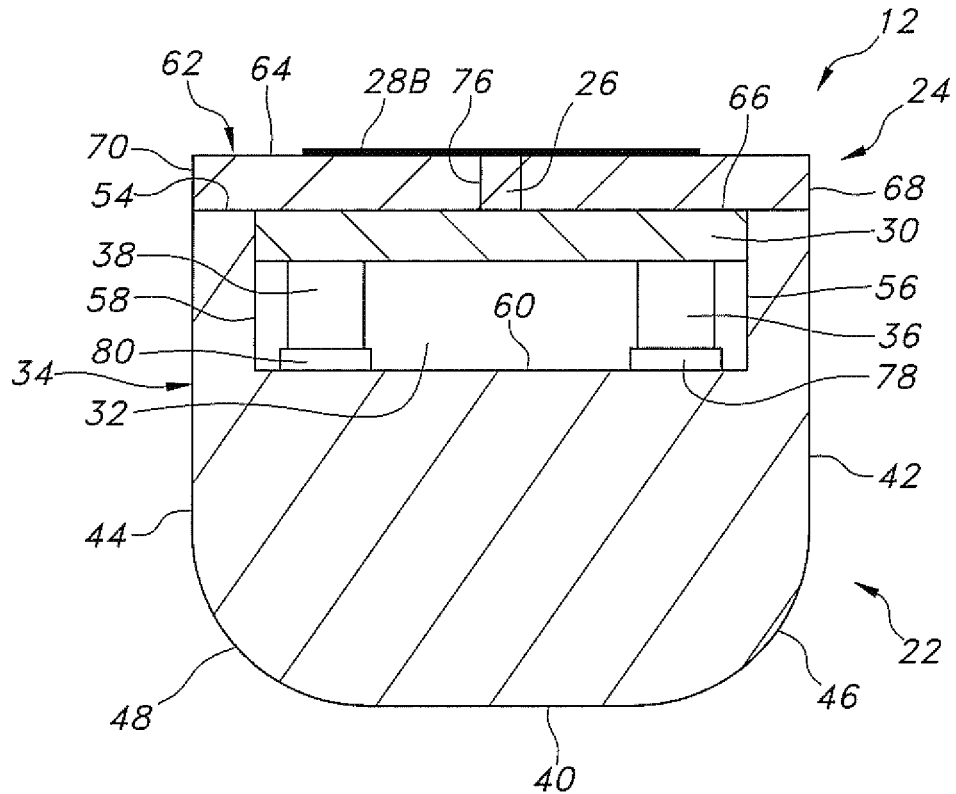
FIG. 4 is a cross-sectional view taken along line 4-4 of FIG. 3A.

Referring now to FIGS. 3A, 3B and 4, they illustrate one embodiment of the leadless active implantable medical device (AIMD) 12 shown in the exemplary medical system 10 (FIG. 2) according to the present invention and that can be implanted in a patient's body tissue including leadless versions of the exemplary medical devices 100A to 100L illustrated in FIG. 1. The AIMD 12 is shown as an elongate device that has an exemplary length of about 15 mm and a diameter of about 4 mm. According to the present invention, however, the shape of the AIMD 12 is not limited to the elongate shape that is shown. For example, the AIMD 12 could have a cylindrical shape or a shape that is not elongated.

The AIMD 12 comprises the rechargeable electrical energy power source 22 supporting a high-purity fused silica wafer assembly 24. The wafer assembly 24 supports at least two electrically conductive pathways (only pathway 26 is shown in FIG. 4) connecting from a respective electrode 28A and 28B to a printed circuit board (PCB) 30. The PCB 30 resides in an elongate recess 32 formed in the housing 34 of the power source 22 and is electrically connected to the power source by opposite polarity terminal pins 36 and 38. Titanium is a preferred material for the power source housing 34.

The electrical energy power source 22 can be a capacitor or a rechargeable battery, for example a hermetically sealed rechargeable Li-ion battery. However, the electrical energy power source 22 is not limited to any one chemistry or even a rechargeable chemistry and can be of an alkaline chemistry, a primary lithium cell, a rechargeable lithium-ion cell, a Ni/cadmium cell, a Ni/metal hydride cell, a supercapacitor, a thin film solid-state cell, and the like. Preferably, the electrical energy power source 22 is a lithium-ion electrochemical cell comprising a carbon-based or $Li_4Ti_5O_{12}$-based anode and a lithium metal oxide-based cathode, such as of $LiCoO_2$ or lithium nickel manganese cobalt oxide ($LiNi_aMn_bCO_{1-a-b}O_2$). The electrical energy power source 22 can also be a solid-state thin film electrochemical cell having a lithium anode, a metal-oxide based cathode and a solid electrolyte, such as an electrolyte of LiPON ($Li_xPO_yN_z$).

The housing 34 for the power source 22 comprises a generally planar bottom wall 40 extending to opposed planar right and left sidewalls 42 and 44. The right and left sidewalls 42, 44 are joined to the bottom wall 40 by curved right and left edges 46 and 48. The right and left sidewalls 42, 44 and the bottom wall 40 extend to opposed curved end walls 50 and 52 of the power source. Further, the right and left sidewalls 42, 44 and the opposed curved end walls 50, 52 extend upwardly to an annular rim 54 that is aligned along an imaginary plane.

The annular rim 54 of the power source surrounds the elongate recess 32, which is defined by recess right and left sidewalls 56 and 58 that extend downwardly to a recess bottom wall 60 and laterally toward but spaced from the opposed curved end walls 50, 52 of the power source. The recess right and left sidewalls 56, 58 are substantially parallel to the respective power source right and left sidewalls 42, 44, while the recess bottom wall 60 is substantially parallel to the bottom wall 40 of the power source 40.

The high-purity fused silica wafer assembly 24 comprises a plate-shaped wafer 62 of high-purity fused silica that has spaced-apart upper and lower major faces 64 and 66 that both extend to and meet with an annular peripheral edge. With the AIMD 12 implanted in body tissue, the upper major face 64 is a body fluid face of the wafer 62 and the lower major face 66 is a device side face of the wafer.

The peripheral edge has spaced-apart right and left sides 68 and 70 that extend to opposed curved ends 72, 74. With the wafer 62 of high-purity fused silica supported on the rim 54 of the power source housing 34, the spaced-apart right and left sides 68, 70 are aligned with the respective right and left sidewalls 42, 44 of the housing 34 and the opposed curved ends 72, 74 are aligned with the respective curved ends walls 50, 52.

As shown in FIG. 4, a via 76 in the high-purity fused silica wafer 62 extends through its thickness from the upper major face 64 to the lower major face 66, generally centered between the spaced-apart right and left sides 68, 70 of the wafer 62. The via 76 is preferably a cylindrically-shaped opening having a diameter that ranges from about 40 µm to about 250 µm.

The via formation process includes first laser etching the first high-purity fused silica wafer 62 (step 100 in FIG. 6), which is a two-step process. The first step structurally modifies the high-purity fused silica wafer 62 by exposing it to laser radiation. It is known that high-purity fused silica has a relatively low light radiation absorbance with radiation wavelengths ranging from about 0.1 µm to 11 µm. The laser spot size is focused on the wafer 62 in order to exceed the threshold for absorbed energy density. The pulse width duration ranges from about 300 fs to about 10,000 fs with a repetition rate ranging from about 250 kHz to about 800 kHz. Laser-induced etching of a high-purity fused silica wafer does not cause any significant residual heat in the wafer between pulses. This lack of residual heat makes laser etching an appropriate technique as it prevents the formation of cracks or similar types of damage to the wafer 62, which is necessary for forming a hermetic via. The resulting cylindrically-shaped via 76 is dimensionally defined by the thickness of the wafer 62 measured from the upper major face 64 to the lower major face 66 while the diameter of the via is defined by the previously described laser-induced etching process. If subsequent thermal processing is required, the wafer 62 is heated to a temperature that is limited to less than 350° C.

After the high-purity fused silica wafer 62 has been exposed to laser-induced etching radiation, the entire wafer is immersed in a chemical etchant. The etchant is a solution of hydrofluoric acid or a caustic solution, for example, of about 30%, by wt., potassium hydroxide. Due to the laser-exposed modification of the high-purity fused silica wafer 62, the exposed regions will be removed in the etchant bath at a much higher rate than unexposed regions. Selectivity, which is defined as the ratio of material removal from the laser-induced etching exposed regions in comparison to the unexposed regions, is higher with the caustic etch solution. The removal rate can be increased by heating the etchant bath to a temperature that ranges from about 50° C. to about 90° C. along with the application of ultrasonic or megasonic agitation of the bath.

Following the etching step, chemical residue on the high-purity fused silica wafer 62 is neutralized with a standard semiconductor cleaning solution, followed by rinsing the wafer in ultra-pure water. To produce a high edge quality via 76, any debris, asperities, or residual material along the via sidewall is removed using a relatively less-selective etchant, such as hydrofluoric acid.

Figure 5A:
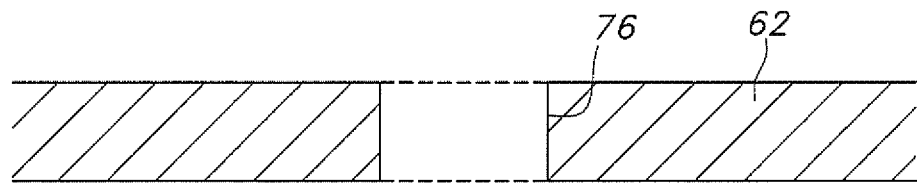
FIGS. 5A to 5D illustrate the steps for providing an electrically conductive pathway 26 extending through a high-purity fused silica wafer 62 according to the present invention.
Figure 5B:
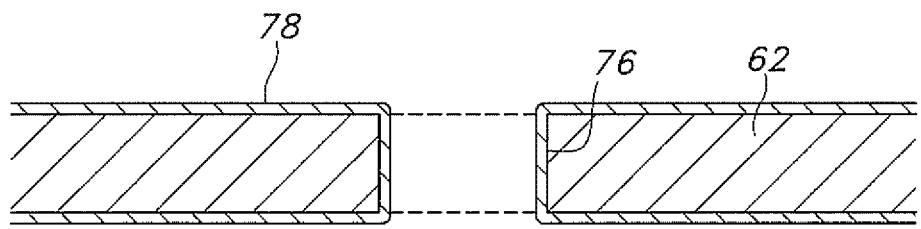
Figure 5C:
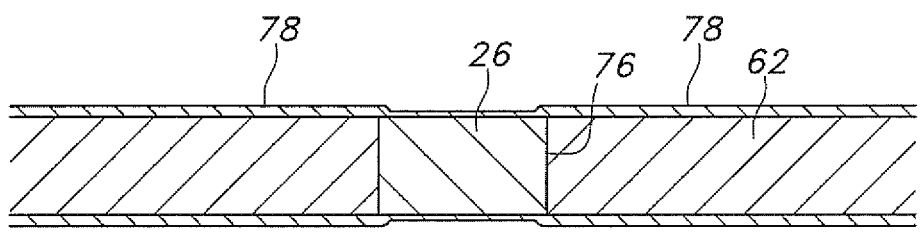
Figure 5D:
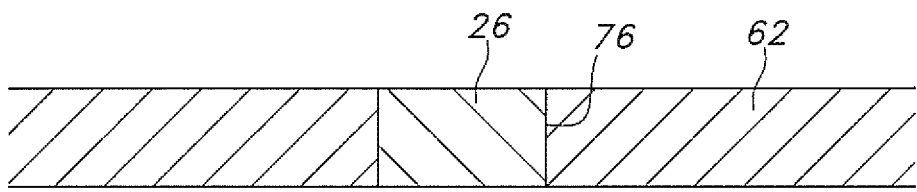
Figure 6:
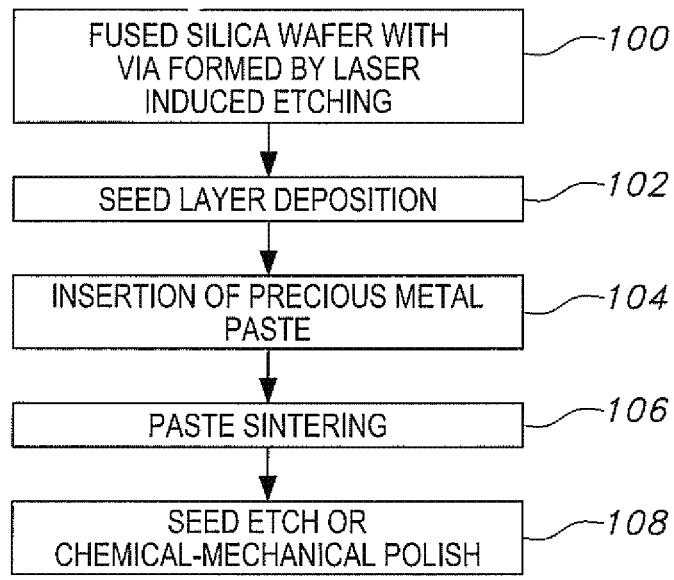
FIG. 6 illustrates a process flow chart for providing an electrically conductive pathway 26 extending through a high-purity fused silica wafer according to the present invention.

As shown in FIGS. 5A to 5D and the flow chart of FIG. 6, the electrically conductive pathway 26 extending through the via 76 in the high-purity fused silica wafer 62 is formed by first depositing a titanium adhesion layer of the wafer, followed by a "seed" layer 78 (step 102 in FIG. 6) at the via using magnetron sputtering. The adhesion and seed layers completely cover the upper and lower faces 64, 66 of the wafer 62 and the sidewall of the via 76, leaving no voids. Gold, an Au/Pt alloy, and rhodium are suitable biocompatible metals for the seed layer 78, with pure gold being preferred. In addition to being biocompatible, these metals and alloys have a suitably low resistivity. The thickness of the seed layer 78 ranges from about 0.1 nm to about 2 µm. Preferred techniques for depositing the adhesion layer and the titanium seed layer 78 include plasma sputtering, magnetron sputtering, electron-beam evaporation, or atomic layer deposition.

The high-purity fused silica wafer 62 is then subjected to an electroplating process to completely fill the seeded via 76 with electrically conductive material 26. Gold, Au/Pt alloy, and rhodium are preferred for the electrically conductive material 26, with gold being preferred. In the electrolytic plating process, the high-purity fused silica wafer 62 is coated with a photoresist and then the vias are exposed by traditional photolithography. In order to prevent voids and seams, ultrasonic agitation and/or surfactants may be used in the electrolytic plating bath.

An alternate method for providing the electrically conductive pathway 26 is to fill the via 76 with a paste or ink of a substantially pure platinum paste (step 104 in FIG. 6). The high-purity fused silica wafer 62 is provided in a brown-state so that sintering is only for the purpose of causing the paste or ink of the platinum-containing material to form a coherent mass by heating the wafer without melting the paste or ink (step 106 in FIG. 6). The sintered platinum is hermetically sealed to the silica without the aid of a metallization contacting the silica in the via 76. A paste is defined as a composition having a viscosity that ranges from about 1×10⁵ to about 1×10¹⁰ centipoise (cP) while an ink has a viscosity that ranges from about 0.1 cP to about 50,000 cP. A suitable process for forming a platinum-containing via in a ceramic substrate is described in U.S. Pat. No. 8,653,384 to Tang et al., which is assigned to the assignee of the present invention and incorporated herein by reference.

According to another embodiment of the present invention, in lieu of the substantially pure platinum paste or ink filled into the via 76, the via is filled with a composite reinforced metal ceramic (CRMC) material. The CRMC material is a platinum-containing material that comprises, by weight %, from about 10:90 ceramic:platinum to about 90:10 ceramic:platinum or, from about 70:30 ceramic:platinum to about 30:70 ceramic: platinum. The ceramic is preferably alumina.

Next, as shown in FIG. 5D, the remaining adhesion layer and the seed layer 78 covering the opposed major faces 64, 66 of the wafer 76 are removed (step 108 in FIG. 6). This is done by etching the wafer with a 30% to 60%, by wt., potassium iodide solution at a temperature ranging from about 25° C. to about 80° C.

An alternative method for removing the adhesion and seed layers from the opposed major faces 64, 66 is to subject the wafer to a chemical-mechanical polishing. In addition to removing the adhesion and seed layers, this polishing step simultaneously planarize the electrically conductive pathway 26 extending through the via 76. The finished electrically conductive pathway 26 has a body fluid side end that resides at the body fluid or upper major face 64 of the fused silica wafer 62 and a device side end that resides at the device side or lower major face 66 of the wafer.

In a manufacturing setting, a typical via array can range from about 100 to about 1,000 vias extending through a host wafer. The wafer 62 depicted in FIGS. 3A, 3B and 4 is then cut out of the host wafer to a shape and size that is suitable for manufacturing the AIMD 12.

The electrically conductive pathway 26 extending through the high-purity fused silica wafer 62 can also be provided by a screen-printing process.

After the high-purity fused silica wafer 62 supporting the electrically conductive pathways 26 is planarized, the electrodes 28A and 28B are contacted to its upper major face 64. The electrodes 28A and 28B may be applied to the wafer 62 by thin and thick film technologies, such as printing, screen printing, pad printing, painting, plating, brush coating, direct bonding, active metal brazing, magnetron sputtering, physical vapor deposition, ion implantation, electroplating, and electroless plating. Since the electrodes 28A and 28B will be exposed to body fluids, and the like, they must be of a biocompatible material, for example, titanium nitride or platinum. Additional suitable biocompatible materials for the electrodes 28A, 28B include gold, gold alloys, rhodium, titanium, molybdenum, and mixtures thereof.

The next step in manufacturing the exemplary AIMD 12 is to condition the surface of the rim 54 of the power source housing and the lower major face 66 of the wafer 62. These surfaces will be in contact with each other and must be conditioned to promote intimate bonding. In that respect, the rim 54 serving as the bonding face for the titanium power source housing 34 is conditioned to a roughness that is preferably less than about 30 nm while the lower face of 66 of the high-purity fused silica wafer 62 is conditioned to a roughness that is less than about 1 nm.

Figure 7:
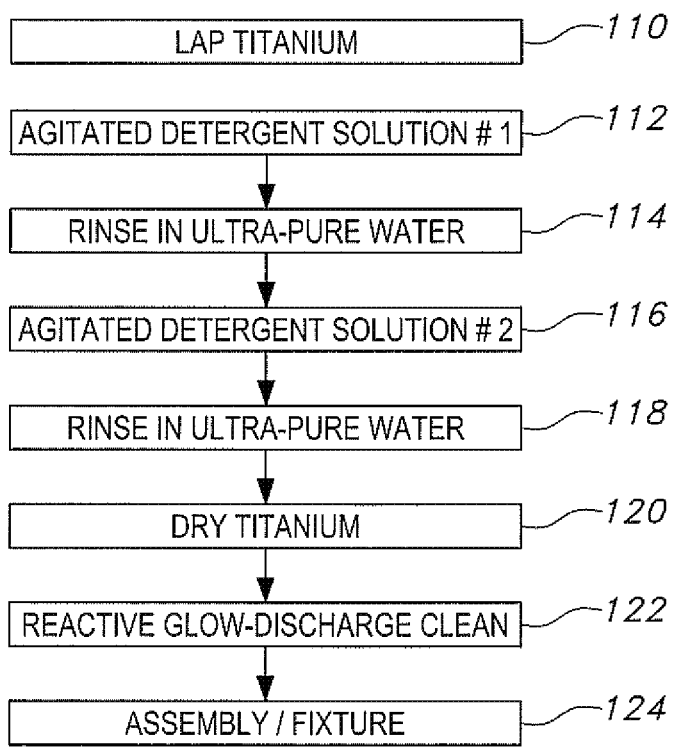
FIG. 7 illustrates a process flow chart for cleaning the titanium housing 34 comprising the electrical energy power source for the AIMD 12.

As illustrated in the process flow chart of FIG. 7, the titanium rim 54 is first subjected to a lapping process (step 110). Then, contaminants introduced at the bonding face of the rim 54 during lapping are removed by immersing the titanium housing 34 in a solution of two commercially available detergents mixed with ultra-pure water. The cleaning solution is heated to a temperature of from about 50° C. to about 90° C. with the housing 34 being subjected to two cleaning cycles. In the first cycle, the cleaning solution is agitated (step 112), for example, through mechanical agitation such as ultra- and/or megasonic-cleaning, followed by rinsing the housing in ultra-pure water (step 114). The second cleaning cycle includes again immersing the housing 34 in an agitated and heated cleaning solution (step 116) that is similar to step 112, followed by a second rinse in ultra-pure water (step 118). Then, the cleaned and rinsed housing 34 is dried in filtered heated nitrogen (step 120). If desired, the titanium housing 22 can be further cleaned using a reactive glow-discharge to a surface energy in excess of about 60 dynes/cm² (step 122).

In tandem, the high-purity fused silica wafer 62 provided with the at least two vias 76 formed by the previously described laser induced etching process is subjected to a standard semiconductor cleaning using a solution of two commercially available detergents mixed with ultra-pure water. In that respect, the cleaning process for the wafer 62 is similar to that described above and illustrated in FIG. 7 for the power source housing 34.

Referring back to FIGS. 3A, 3B and 4, following cleaning, the high-purity fused silica wafer 62 with the at least two electrically conductive pathways 26 extending therethrough is then mounted on the rim 54 of the housing 34 for the electrical energy power source 22. With the high-purity fused silica wafer 62 and the titanium rim 54 in intimate registry contact with each other, the assembly is subjected to a pneumatic pressure that is significant enough to ensure optical contact of the wafer 62 with the titanium rim 54. An optical cover glass (not shown) that is transparent to an incident laser beam is positioned in contact with the upper major face 64 of the wafer 62, opposite the housing rim 54. A laser light directed at the transparent cover glass then penetrates through the cover glass to cause interdiffusion of the fused silica and titanium atoms at the interface of the wafer 62 contacting the housing rim 54.

Critical laser bonding parameters for the laser and its beam include the numerical aperture (NA) of the laser and the spot size, focal length, pulse energy, pulse width, frequency, and focal length of the laser beam. Suitable microbonding welds are achieved using a laser with a spot size of about 1 µm to about 10 µm, a numerical aperture (NA) of about 0.2 to about 0.8, a focal length that ranges from about 10 mm to about 30 mm, a pulse energy that ranges from about 30 µJ to about 50 µJ, a pulse width that ranges from about 400 fs to about 800 fs at a frequency that ranges from about 200 kHz to about 800 kHz with an average power that ranges from about 10 W to about 15 W. The laser beam has a wavelength that ranges from ultraviolet light at about 355 nm to infrared radiation (IR) at about 1030 nm. A suitable laser is one that produces a Bessel-like light beam, however, it is noted that the present invention is not limited to the beam source and the specific weld parameters described above. Instead, they are exemplary.

Figure 8:
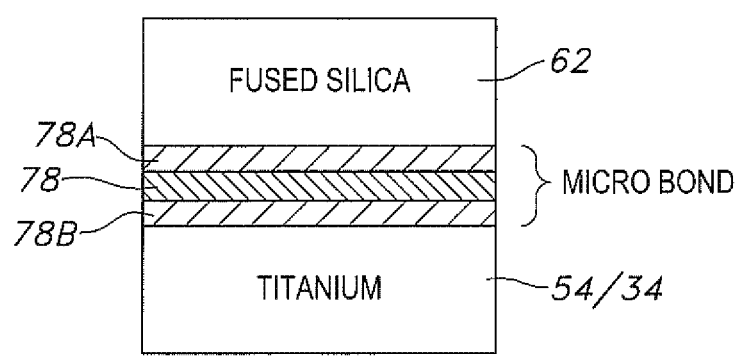
FIG. 8 is a schematic illustration of a micro-weld or micro-bond between a high-purity fused silica wafer 62 and the rim 54 of the titanium housing 34 for the power source housing 22 of the AIMD 12.

As illustrated in FIG. 8, the resulting micro-bond or interdiffusion region 78 between the high-purity fused silica wafer 62 and the rim 54 of the titanium housing 34 for the electrical energy power source 22 constitutes both silica and titanium phases and has a thickness that ranges from about 2 µm to about 5 µm. The chemistry of the micro-bond layer 78A in close proximity to the high-purity fused silica wafer 62 is silica rich and titanium deficient. Conversely, in the vicinity of the titanium housing 54, the micro-bond layer 78B is titanium rich and silica deficient.

That the interdiffusion region 78 has a thickness ranging from about 2 µm to about 5 µm is in comparison to a sapphire to titanium micro-bond where the diffusion bond layer thickness ranges up to about 1 micron. A thicker diffusion bond layer provides better reliability of the micro-bonded assembly in terms of structural integrity.

In the case of a first high-purity fused silica wafer micro-bonded to a second high-purity fused silica wafer, the chemistry of the interdiffusion layer remains uniform throughout the micro-bond with the weld pool morphology reflecting evidence of material re-precipitation and void formation due to outgassing of glass during the welding process.

With the high-purity fused silica wafer 62 micro-bonded to the rim 54 of the power source housing 34, the electrodes 28A, 28B supported on the upper major face 64 of the wafer are in electrical continuity with the PCB 30 contacting the lower major face 66 of the plate-shaped wafer 62 or contacting a circuit trace supported on the lower major face 66. The PCB 30 supports at least one, and preferably a plurality of electronic components (not shown) including an application-specific integrated circuit (ASIC) as an assembly that controls the various functions performed by the AIMD 12. These include, but are not limited to, receiving sensed electrical signals from the electrodes 28A, 28B pertaining to functions of the body tissue in which the AIMD 12 is implanted and for delivering electrical current pulses to the body tissue through the electrodes 28A and 28B.

The PCB 30 is electrically connected to the spaced-apart terminal pins 36 and 38 that in turn are electrically connected to the opposed polarity terminals 80 and 82 of the electrical energy power source 22. If the power source 22 is of a case-negative design, one of the terminal pins, for example terminal pin 36, is connected to the negative terminal 80 of the negative polarity housing 34 while the other terminal pin 38 is connected to a positive cathode terminal 82 that is electrically isolated from the power source housing 34. In the alternative, the power source 22 can have a case-positive design, which means that one of the terminal pins, for example terminal pin 38, is connected the positive terminal 82 of the positive polarity housing 34 while the other terminal pin 36 is connected to a negative anode terminal 80 that is electrically isolated from the power source housing 34.

The power source can also be of a case-neutral design, which means that the housing 34 is neither the negative terminal nor the positive terminal for the power source. Instead, the power source 22 supports opposed negative and positive polarity terminals 80, 82 that are both electrically isolated from the neutral housing and connected to the respective anode and cathode terminal pins 36 and 38. In that respect, the negative and positive polarity terminals 80, 82 are in electrical continuity with the anode and cathode housed inside the housing 34.

The PCB 30 also supports an inductive charging antenna (not shown) connected to a charging circuit (not shown). The charging circuit is configured to convert RF or inductive energy signals received by the inductive charging antenna from the external charging pad 20 connected to the external charger 14 (FIG. 2) into a direct current voltage to charge the electrical energy power source 22 to power the electronic components of the PCB 30. Since the charging antenna will not come into contact with body fluids, it can be made from a less expensive, non-biocompatible material, for example, copper. For a more thorough discussion of a suitable charging antenna, reference is made to U.S. patent application Ser. No. 17/878,330, filed on Aug. 1, 2022. This application is assigned to the assignee of the present invention and incorporated herein by reference.

Figure 9A:
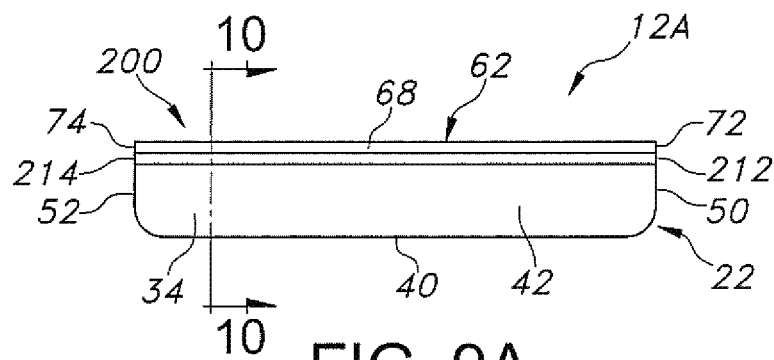
FIG. 9A is a side elevational view of another embodiment of an active implantable medical device (AIMD) 12A according to the present invention.
Figure 9B:
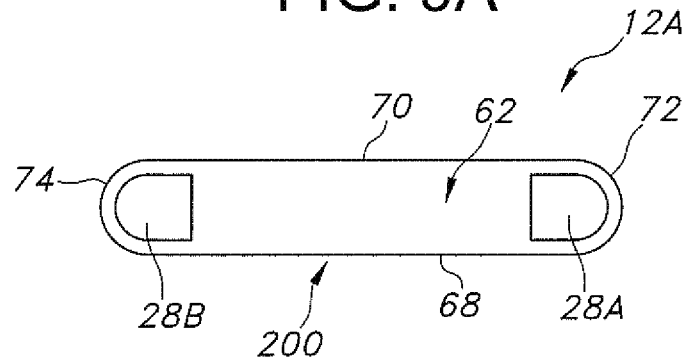
FIG. 9B is a plan view of the AIMD 12A shown in FIG. 9A.
Figure 10:
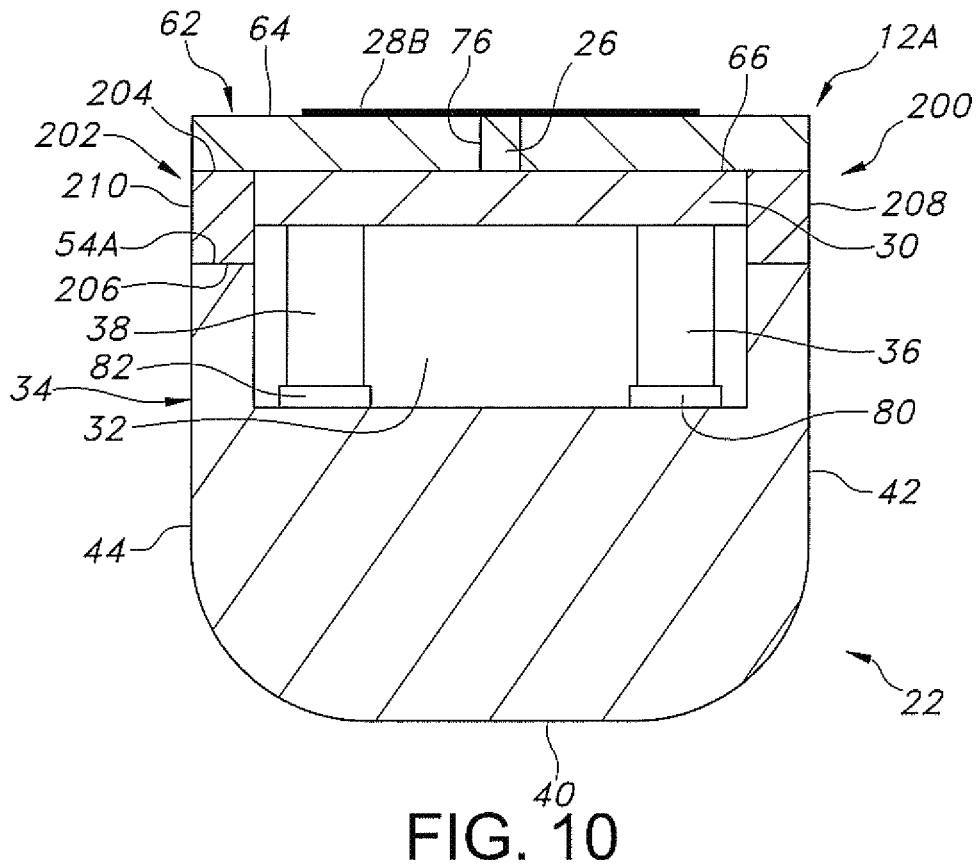
FIG. 10 is a cross-sectional view taken along line 10-10 of FIG. 9A.

Referring now to FIGS. 9A, 9B and 10, they illustrate another embodiment of a leadless active implantable medical device (AIMD) 12A that is suitable for the exemplary medical system 10 illustrated in FIG. 2. The exemplary AIMD 12A is any one of various types of known implantable medical devices that can be implanted in a patient's body tissue including leadless versions of the exemplary medical devices 100A to 100L illustrated in FIG. 1.

As with the AIMD 12 illustrated in FIGS. 3A, 3B and 4, the AIMD 12A comprises the rechargeable electrical energy power source 22 supporting a high-purity fused silica wafer assembly 200. However, the wafer assembly 200 is different than the previously described wafer assembly 24, which comprised the single plate-shaped wafer 62 of high-purity fused silica. The wafer assembly 200 for the AIMD 12A comprises the plate-shaped wafer 62 supported on a ring-shaped wafer 202, which is also of high-purity fused silica. The ring-shaped wafer 202 has spaced-apart upper and lower major faces 204 and 206 that extend to and meet with a peripheral edge. The peripheral edge has spaced-apart right and left sides 208 and 210 that extend to opposed curved ends 212, 214.

Further, the right and left sides 208, 210 and the curved ends 212 and 214 of the wafer 202 surround an interior opening 216, which gives the wafer its ring-shape. The significance of the ring-shaped wafer 202 of high-purity fused silica will be described in detail hereinafter.

With the ring-shaped wafer 202 of high-purity fused silica micro-bonded on the rim 54 of the power source housing 34 and the plate-shaped wafer 62 micro-bonded to the ring-shaped wafer 202, the spaced-apart right and left sides 68, 70 of the plate-shaped wafer 62 are aligned with the spaced-apart right and left sides 208, 210 of the ring-shaped wafer 202 which, in turn, are aligned with the respective right and left sidewalls 42, 44 of the power source housing 34. Further, the opposed curved ends 72, 74 of the plate-shaped wafer 62 are aligned with the opposed curved ends 212, 214 of the ring-shaped wafer 202 which, in turn, are aligned with the respective opposed curved ends walls 50, 52 of the housing 34 for the electrical energy power source 22.

An important benefit of the double wafer design for the AIMD 12A shown in FIGS. 9A, 9B and 10 is that the charging antenna connected to the rechargeable electrical power source 22 is positioned laterally inside the opening of the ring-shaped high-purity fused silica wafer 202. This means that RF or inductive energy signals received by the charging antenna from the external charging pad 20 connected to the external charger 14 (FIG. 2) are able to reach the charging antenna more efficiently in comparison to the AIMD 12 illustrated in FIGS. 3A, 3B and 4. That is because RF or inductive energy signals readily pass through the ring-shaped wafer 202, which minimizes Eddy currents and improves the efficiency of the inductive charging antenna. This means that the charging antenna in the AIMD 12A received RF or inductive energy signals that pass through both the plate-shaped fused silica wafer 62 and that pass through the ring-shaped wafer 202. Then, the charging circuit connected to the charging antenna is configured to convert the RF or inductive energy signals received by the inductive charging antenna from the external charging pad 20 connected to the external charger 14 (FIG. 2) into a direct current voltage to charge the electrical power source 22 to power the electronic components of the PCB 30.

In contrast, with the previously described AIMD 12 shown in FIG. 4, RF or inductive energy signals only pass through the plate-shaped wafer 62 to the charging antenna. So, positioning the charging antenna laterally aligned with the rim 54 of the power source housing 52 means that the charging antenna predominately receives RF or inductive energy signals that pass through the plate shaped fused silica wafer 62, as the rim 54 tends to attenuate the RF or inductive energy signals.

Figure 11A:
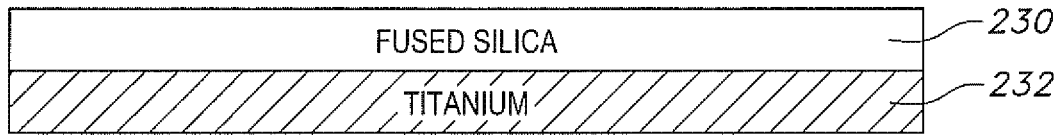
FIG. 11A is a schematic illustration of a first high-purity fused silica wafer 230 micro-bonded to a titanium substrate 232.

In a general sense, the present invention is directed to micro-bonding at least one high-purity fused silica wafer to a titanium substrate. This is illustrated in FIG. 11A where a first high-purity fused silica wafer 230 is micro-bonded to a titanium substrate 232. To ensure good optical contact, the high-purity fused silica wafer 230 and the titanium substrate 232 are subjected to pneumatic pressure. Then, electromagnetic (EM) radiation at a given wavelength is applied to the fused silica wafer 230 for interdiffusion of fused silica atoms to titanium atoms to take place. Since the titanium substrate 232 is opaque to the applied EM radiation, the result is a micro-bond that is formed at the interface of the fused silica wafer 230 and the titanium substrate 232. As previously described with respect to FIG. 8, when the first high-purity fused silica wafer 230 is micro-bonded to the titanium substrate 232, the bond thickness ranges from about 2 µm to about 5 µm.

Figure 11B:
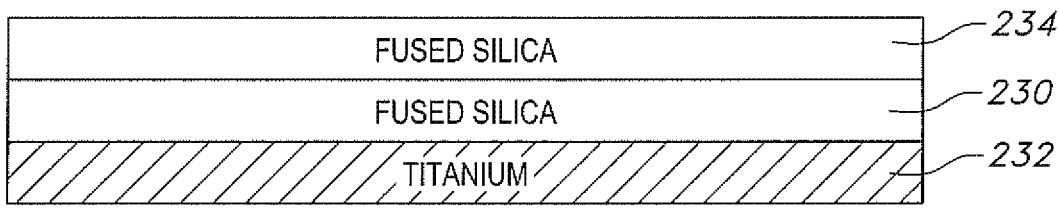
FIG. 11B is a schematic illustration of a second high-purity fused silica wafer 234 micro-bonded to the first high-purity fused silica wafer 230 shown in the assembly of FIG. 11A.

FIG. 11B illustrates a further embodiment of the present invention. In this embodiment, a second high-purity fused silica wafer 234 is stacked on top of the first fused silica wafer 230 in the assembly shown in FIG. 11A. To ensure good optical contact, the second fused silica wafer 234 stacked on top of the first fused silica wafer 230 micro-bonded to the titanium substrate 232 is subjected to pneumatic pressure. Then, electromagnetic (EM) radiation at a given wavelength is applied to the second fused silica wafer 234 for interdiffusion of fused silica atoms to the silica atoms of the first high-purity fused silica wafer 230. When the first high-purity fused silica wafer 230 is micro-bonded to the second high-purity fused silica wafer 234, the micro-bond thickness between the wafers 230, 234 ranges from about 60 µm to about 120 µm. The mechanism related to micro-bonding two high-purity fused silica wafers to each other is described below with respect to FIGS. 11C and 11D.

The wafer-scale constructions illustrated in FIGS. 11A and 11B include high-purity fused silica and titanium wafers having thicknesses that range from about 100 µm to about 4 mm. The high-purity fused silica wafers and the titanium substrate can have diameters that ranges from about 100 nm to about 200 mm.

Figure 11C:
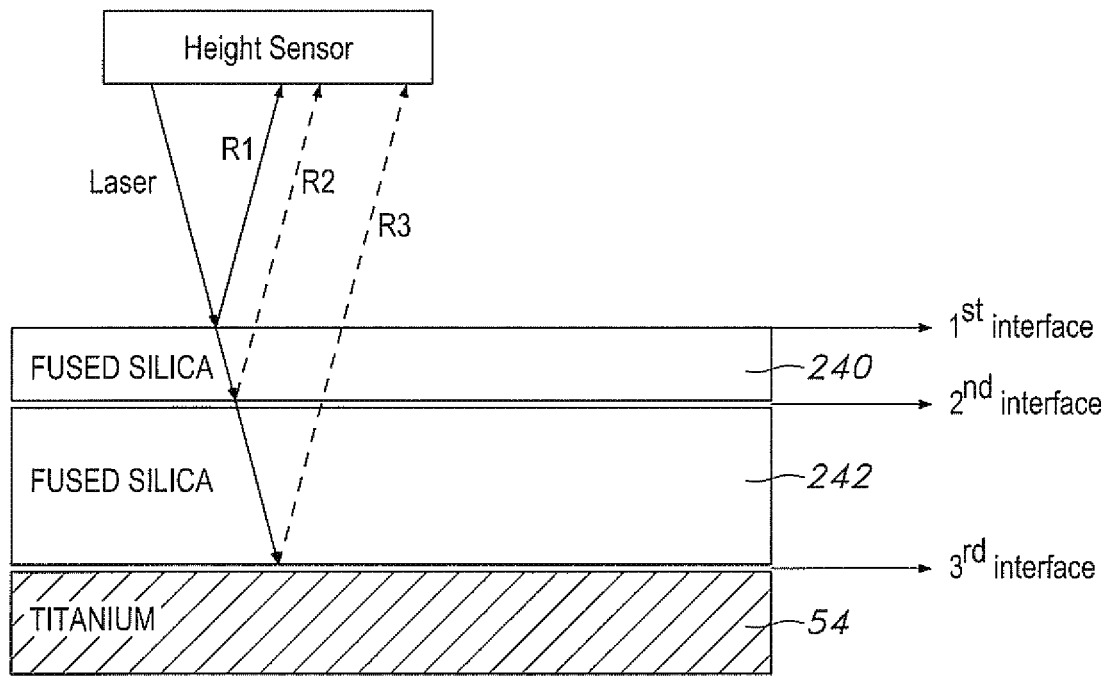
FIG. 11C As a schematic drawing showing two high-purity fused silica wafers 240 and 242 stacked of a titanium substrate (rim 45) for one embodiment of micro-welding process according to the present in invention.

Referring now to FIG. 11C, it is within the scope of the present invention that two high-purity fused silica wafers 240 and 242 can be triple stacked on top of a titanium substrate (rim 45 of power source housing 62) for the welding process. The laser station is equipped with a height sensor capable of detecting the interface positions between the first and second silica wafer 240, 242 and between the second fused silica wafer 242 and the titanium substrate (rim 54). This is achieved by measuring the relative intensities of the light reflected from each of the interfaces. It is known that air has a refractive index of 1.0, high-purity fused silica has a refractive index of 1.45 and titanium has a refractive index of 2.15.

Figure 11D:
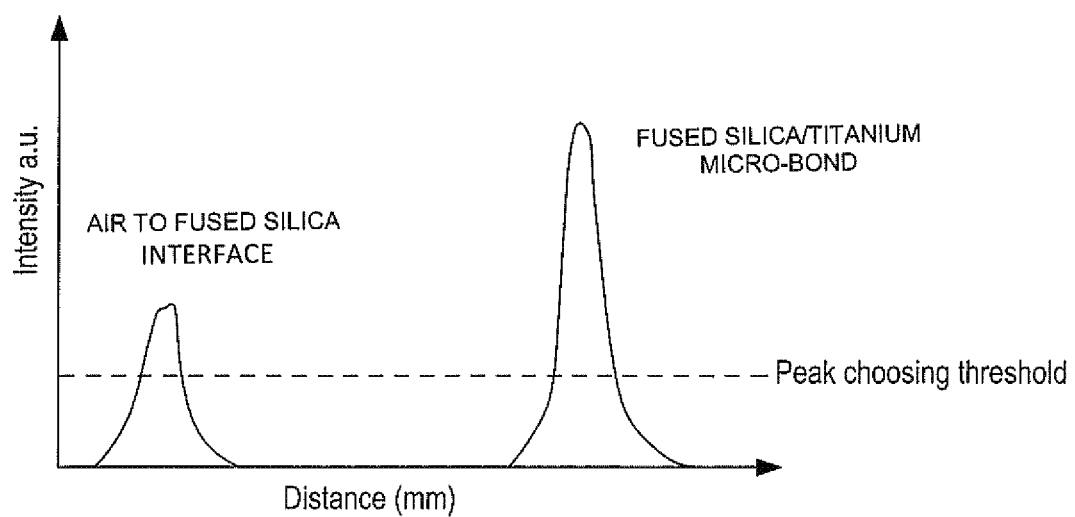
FIG. 11D is a graph showing the difference in the refractive indices between high-purity fused silica and titanium.

As shown in the graph of FIG. 11D, the variations of the intensities, which is attributed to the difference in the refractive indices between high-purity fused silica and titanium, can then be observed in the form of peak formations. The laser beam can be tuned to focus on the individual peaks shown in the graph, thus targeting the specific interface during the welding process. That is how it is possible to micro-weld two high-purity fused silica wafers to each other.

Figure 12:
FIG. 12 is a photograph showing, in cross-section, a high-purity fused silica wafer micro-bonded to a titanium substrate.

FIG. 12 is a photograph showing, in cross-section, a high-purity fused silica wafer micro-bonded to a titanium substrate. The micro-bond has a thickness that ranges from about 2 µm to about 5 µm.

Figure 13:
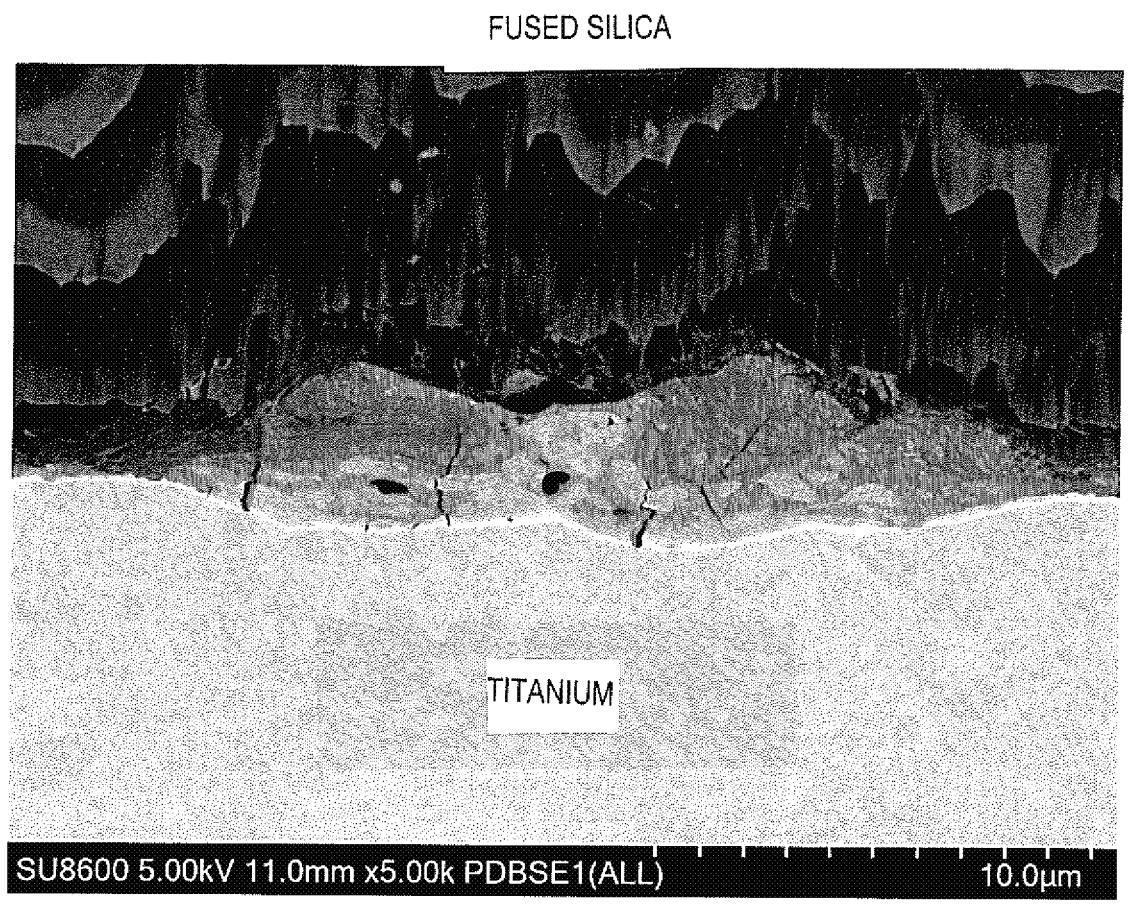
FIG. 13 is a photograph showing, in enlarged cross-section, a high-purity fused silica wafer micro-bonded to a titanium substrate.

FIG. 13 is a photograph showing, in enlarged cross-section, a high-purity fused silica wafer micro-bonded to a titanium substrate. The micro-bond weld width ranges from about 40 µm to about 100 µm.

It is appreciated that various modifications to the inventive concepts described herein may be apparent to those skilled in the art without departing from the spirit and scope of the present invention as defined by the hereinafter appended claims.

What is claimed is:

1. An active implantable medical device (AIMD), comprising:
   a) an electrical energy power source comprising a titanium housing having an annular sidewall extending to a rim, wherein the housing sidewall and rim surround and define a power source housing recess;
   b) a printed circuit board (PCB) assembly contained inside the power source housing recess, the PCB assembly comprising a printed circuit board supporting at least one electronic component;
   c) a plate-shaped wafer of high-purity fused silica comprising spaced-apart wafer body fluid and device side major faces;
   d) at least two electrically conductive pathways extending through the fused silica wafer to a conductive pathway body fluid side end spaced from a conductive pathway device side end; and
   e) at least two spaced-apart electrodes supported on the body fluid major face of the fused silica wafer, the at least two spaced-apart electrodes being in electrical continuity with a respective one of the conductive pathway body fluid side ends,
   f) wherein the conductive pathway device side end of each of the at least two conductive pathways is in electrical continuity with the PCB assembly, and wherein the wafer device side major face is micro-bonded to the rim of the titanium housing to hermetically seal the power source housing recess containing the PCB assembly, and
   g) wherein the electrical energy power source is electrically connected to the PCB assembly to provide electrical power to the at least one electronic component.

2. The AIMD of claim 1, wherein the high-purity fused silica wafer has a thickness extending to the wafer body fluid and device side major faces that ranges from 100 µm to 4 mm.

3. The AIMD of claim 1, wherein the micro-bond between the rim of the titanium housing and the device side major face of the high-purity fused silica wafer ranges from 2 µm to 5 µm.

4. The AIMD of claim 1, wherein, with the at least one electronic component being electrically energized, the at least two electrodes electrically connected to the PCB assembly by the respective electrically conductive pathways are configured to at least one of receive sensed electrical signals pertaining to functions of a body tissue in which the AIMD is implanted and deliver electrical current pulses to the body tissue.

5. The AIMD of claim 1, wherein the electrically conductive pathways are selected from the group consisting of gold, Au/Pt alloy, and rhodium.

6. The AIMD of claim 1, wherein the electrically conductive pathways are sintered platinum-containing pathways.

7. The AIMD of claim 1, wherein the at least two electrodes are made of titanium nitride or platinum.

8. The AIMD of claim 1, wherein the electrical energy power source is rechargeable comprising a carbon-based or $Li_4Ti_5O_{12}$-based anode and a cathode selected from $LiCoO_2$ or lithium nickel manganese cobalt oxide ($LiNi_aMn_bCo_{1-a-b}O_2$).

9. The AIMD of claim 1, wherein the PCB assembly contacts the device side major face of the fused silica wafer.

10. The AIMD of claim 1, further comprising a charging coil contained inside the hermetically sealed power source housing recess, wherein the charging circuit is connected to a charging circuit which is configured to convert RF or inductive energy received from the charging coil into a direct current voltage to charge the electrical energy power source to power the PCB assembly.

11. An active implantable medical device (AIMD), comprising:
a) an electrical energy power source comprising a titanium housing having an annular sidewall extending to a rim, wherein the housing sidewall and rim surround and define a housing recess;
b) a printed circuit board (PCB) assembly contained inside the power source housing recess, the PCB assembly comprising a printed circuit board supporting at least one electronic component;
c) a first ring-shaped wafer of high-purity fused silica comprising spaced-apart first ring-shaped wafer body fluid and device side major faces;
d) a second plate-shaped wafer of high-purity fused silica comprising spaced-apart second plate-shaped wafer body fluid and device side major faces;
e) at least two electrically conductive pathways extending through the second plate-shaped wafer to a conductive pathway body fluid side end spaced from a conductive pathway device side end; and
f) at least two spaced-apart electrodes supported on the body fluid major face of the second plate-shaped fused silica wafer, the at least two spaced-apart electrodes being in electrical continuity with a respective one of the conductive pathway body fluid side ends,
g) wherein the conductive pathway device side end of each of the at least two conductive pathways is in electrical continuity with the PCB assembly, and wherein the second plate-shaped wafer device side major face is micro-bonded to the first ring-shaped wafer body fluid major face and the first ring-shaped wafer device side major face is micro-bonded to the rim of the titanium housing to hermetically seal the power source housing recess containing the PCB assembly, and h) wherein the electrical energy power source is electrically connected to the PCB assembly to provide electrical power to the at least one electronic component.

12. The AIMD of claim 11, wherein the first and second high-purity fused silica wafers each have a thickness extending to their respective wafer body fluid and device side major faces that ranges from 100 μm to 4 mm.

13. The AIMD of claim 11, wherein the micro-bond between the rim of the titanium housing and the first ring-shaped high-purity fused silica wafer device side major face ranges from 2 μm to 5 μm.

14. The AIMD of claim 11, wherein the micro-bond between the body fluid device side major face of the first ring-shaped high-purity fused silica wafer and second plate-shaped high-purity fused silica wafer device side major face ranges from 60 μm to 120 μm.

15. The AIMD of claim 11, wherein, with the at least one electronic component being electrically energized, the at least two electrodes electrically connected to the PCB assembly by the respective electrically conductive pathways are configured to at least one of receive sensed electrical signals pertaining to functions of a body tissue in which the AIMD is implanted and deliver electrical current pulses to the body tissue.

16. The AIMD of claim 11, wherein the electrically conductive pathways are selected from the group consisting of gold, Au/Pt alloy, and rhodium.

17. The AIMD of claim 11, wherein the at least two electrodes are made of platinum.

18. The AIMD of claim 11, wherein the electrical energy power source is rechargeable comprising a carbon-based or $Li_4Ti_5O_{12}$-based anode and a cathode selected from $LiCoO_2$ or lithium nickel manganese cobalt oxide ($LiNi_aMn_bCo_{1-a-b}O_2$).

19. The AIMD of claim 11, further comprising a charging coil contained inside the hermetically sealed power source housing recess, wherein the charging circuit is laterally aligned with the first ring-shaped fused silica wafer and is connected to a charging circuit which is configured to convert RF or inductive energy received from the charging coil into a direct current voltage to charge the electrical energy power source to power the PCB assembly.

20. An assembly, comprising:
a) a titanium housing having an annular sidewall extending to a rim, wherein the housing sidewall and rim surround and define a housing recess;
b) a plate-shaped wafer of high-purity fused silica comprising spaced-apart wafer upper and lower major faces; and
c) at least two electrically conductive pathways extending through the fused silica wafer to a conductive pathway body fluid side end spaced from a conductive pathway device side end,
d) wherein the wafer lower major face is micro-bonded to the rim of the titanium housing to hermetically seal the housing recess.

* * * * *